United States Patent
Honda et al.

(10) Patent No.: US 10,326,255 B2
(45) Date of Patent: Jun. 18, 2019

(54) LASER DEVICE

(71) Applicant: FANUC CORPORATION, Yamanashi (JP)

(72) Inventors: Masahiro Honda, Yamanashi (JP); Munekazu Matsuda, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 8 days.

(21) Appl. No.: 15/876,248

(22) Filed: Jan. 22, 2018

(65) Prior Publication Data
US 2018/0214978 A1    Aug. 2, 2018

(30) Foreign Application Priority Data
Feb. 1, 2017 (JP) ................................. 2017-016675

(51) Int. Cl.
*H01S 5/024* (2006.01)
*B23K 26/21* (2014.01)
(Continued)

(52) U.S. Cl.
CPC ...... *H01S 5/02423* (2013.01); *B23K 26/0626* (2013.01); *B23K 26/21* (2015.10);
(Continued)

(58) Field of Classification Search
CPC ............. H01S 5/02423; H01S 5/02438; H01S 5/02284; H01S 5/02216; H01S 3/2308;
(Continued)

(56) References Cited

U.S. PATENT DOCUMENTS

| 6,137,816 A | * | 10/2000 | Kinbara | .............. | H01S 5/02248 |
| | | | | | 372/29.012 |
| 9,667,030 B2 | * | 5/2017 | Takigawa | ................ | H01S 5/022 |

(Continued)

FOREIGN PATENT DOCUMENTS

| CN | 101350677 A | 1/2009 |
| CN | 102474068 A | 5/2012 |

(Continued)

OTHER PUBLICATIONS

An Office Action; "Notification of Reasons for Refusal," issued by the Japanese Patent Office dated Aug. 7, 2018, which corresponds to Japanese Patent Application No. 2017-016675 and is related to U.S. Appl. No. 15/876,248; with English language translation.

(Continued)

*Primary Examiner* — Yuanda Zhang
(74) *Attorney, Agent, or Firm* — Studebaker & Brackett PC (57) ABSTRACT

A laser device includes a light-emitting unit that generates a laser beam, an amplification unit that amplifies the laser beam generated by the light-emitting unit, a power supply unit that supplies power for generating the laser beam to the light-emitting unit, a plate-like cooling unit including a first cooling surface and a second cooling surface positioned opposite to the first cooling surface, and a housing in which the light-emitting unit, the amplification unit, the power supply unit, and the cooling unit are housed. The power supply unit and the light-emitting unit are arranged adjacent to the first cooling surface of the cooling unit. The amplification unit is arranged adjacent to the second cooling surface of the cooling unit.

5 Claims, 9 Drawing Sheets

(51) Int. Cl.
  *B23K 26/06* (2014.01)
  *B23K 26/38* (2014.01)
  *B23K 37/00* (2006.01)
  *H01S 3/23* (2006.01)
  *H01S 5/022* (2006.01)

(52) U.S. Cl.
  CPC ............ *B23K 26/38* (2013.01); *B23K 37/003* (2013.01); *H01S 5/02438* (2013.01); *H01S 3/2308* (2013.01); *H01S 5/02216* (2013.01); *H01S 5/02236* (2013.01); *H01S 5/02284* (2013.01)

(58) Field of Classification Search
  CPC . H01S 5/02236; B23K 26/0626; B23K 26/21; B23K 37/003; B23K 26/38
  See application file for complete search history.

(56) References Cited

U.S. PATENT DOCUMENTS 9,837,789 B2 * 12/2017 Takigawa ............ H01S 5/02407
2018/0062347 A1 * 3/2018 Hodges ................ B23K 26/703

FOREIGN PATENT DOCUMENTS

| | | |
|---|---|---|
| CN | 103765751 A | 4/2014 |
| JP | H06-66049 U | 9/1994 |
| JP | 2001-320111 A | 11/2001 |
| JP | 2002-16307 A | 1/2002 |
| JP | 2003-234534 A | 8/2003 |
| JP | 2007-188934 A | 7/2007 |
| JP | 2008-244223 A | 10/2008 |
| JP | 2009-218299 A | 9/2009 |
| JP | 2015-197652 A | 11/2015 |
| JP | 2016-225504 A | 12/2016 |

OTHER PUBLICATIONS

An Office Action mailed by the Japanese Patent Office dated May 15, 2018, which corresponds to Japanese Patent Application No. 2017-016675 and is related to U.S. Appl. No. 15/876,248.

An Office Action issued by the Chinese Patent Office dated Feb. 19, 2019, which corresponds to Chinese Patent Application No. 201810089322.6 and is related to U.S. Appl. No. 15/876,248; with English language translation.

* cited by examiner

LASER DEVICE

This application is based on and claims the benefit of priority from Japanese Patent Application No. 2017-016675, filed on Feb. 1, 2017, the content of which is incorporated herein by reference.

BACKGROUND OF THE INVENTION

Field of the Invention

The present invention relates to a laser device that outputs a laser beam.

Related Art

Conventionally, a laser beam has been used for cutting of metal or nonmetal, welding, etc. A laser device that outputs a laser beam of this type includes a power supply unit, a laser diode (LD) module, a cavity, etc. All these parts generate heat while running (hereinafter also called "heat-generating parts"). Hence, these heat-generating parts are required to be cooled during operation of the laser device. In the conventional laser device, these heat-generating parts are cooled by using a water-cooling plate with a water-cooling pipe embedded in the water-cooling plate, for example (see patent documents 1 and 2, for example).

Patent Document 1: Japanese Unexamined Patent Application, Publication No. 2002-16307

Patent Document 2: Japanese Unexamined Patent Application, Publication No. 2003-234534

SUMMARY OF THE INVENTION

Regarding low-output laser device that produces an output of 1 kW or less, for example, a housing for this laser device is required to be more compact. Meanwhile, making the housing compact reduces space for installation of each part, resulting in reduction in a distance between parts. This makes it difficult to cool a heat-generating part efficiently with a water-cooling plate inside the housing.

The present invention intended to provide a laser device capable or cooling a heat-generating part more efficiently while achieving a compact size.

(1) The present invention relates to a laser device (laser device 1 described later, for example) comprising: a light-emitting unit (LD module 2 described later, for example) that generates a laser beam; an amplification unit (cavity 3 described later, for example) that amplifies the laser beam generated by the light-emitting unit; a power supply unit (power supply unit 4 described later, for example) that supplies power for generating the laser beam to the light-emitting unit; a plate-like cooling unit (water-cooling plate 10 described later, for example) including a first cooling surface (first cooling surface 10a described later, for example) and a second cooling surface (second cooling surface 10b described later, for example) positioned opposite to the first cooling surface; and a housing (housing 20 described later, for example) in which the light-emitting unit, the amplification unit, the power supply unit, and the cooling unit are housed. The power supply unit and the light-emitting unit are arranged adjacent to the first cooling surface of the cooling unit. The amplification unit is arranged adjacent to the second cooling surface of the cooling unit.

(2) The laser device described in (1) may further comprise a control unit (control unit 6 described later, for example) that controls supply of power from the power supply unit to the light-emitting unit. The control unit may be arranged in such a manner that, in the thickness direction of the cooling unit, a gap is formed between the control unit and the power supply unit or the light-emitting unit arranged at the first cooling surface of the cooling unit.

(3) The laser device described in (1) or (2) may further comprise a power cutoff unit (power cutoff unit 5 described later, for example) that allows interruption of supply of power from the power supply unit to the light-emitting unit. The power cutoff unit may be arranged at a position not overlapping the cooling unit in the thickness direction of the cooling unit. The housing may include an opening part (opening part 215 described later, for example) formed in a side surface facing the power cutoff unit for allowing putting in and taking out of at least one part of the power cutoff unit.

(4) In the laser device described in any one of (1) to (3), the cooling unit may be fixed to support members (support fittings 31 described later, for example) provided at least two side surfaces of the housing.

(5) In the laser device described in any one of (1) to (4), at least one of the power supply unit, the light-emitting unit, and the amplification unit may be arranged at the cooling unit having interposed therebetween an intermediate member having heat conductivity (heat-conducting sheet S described later, for example).

A laser device provided by the present invention is capable of cooling a heat-generating part more efficiently while achieving a compact size.

DETAILED DESCRIPTION OF THE INVENTION

An embodiment of the present invention will be described below. All the drawings accompanying the present specification are schematic views. To facilitate understanding, etc., illustration of each part is changed from an actual object or exaggerated in terms of a shape, a scale, or a dimensional aspect ratio, for example. In the drawings, hatching showing a cross section of a member is omitted, where appropriate. In the present specification, etc., one crosswise direction of a laser device 1 an X (X1-X2) direction. A crosswise direction perpendicular to the X direction is a Y (Y1-Y2) direction. The thickness direction of the laser device 1 (a direction perpendicular to an X-Y plane) is a Z (Z1-Z2) direction. The shape of the laser device 1 viewed in the thickness direction (Z direction) is not limited to a rectangular shape as in this embodiment, but it may also be a square shape or a trapezoidal shape, for example.

Figure 1:
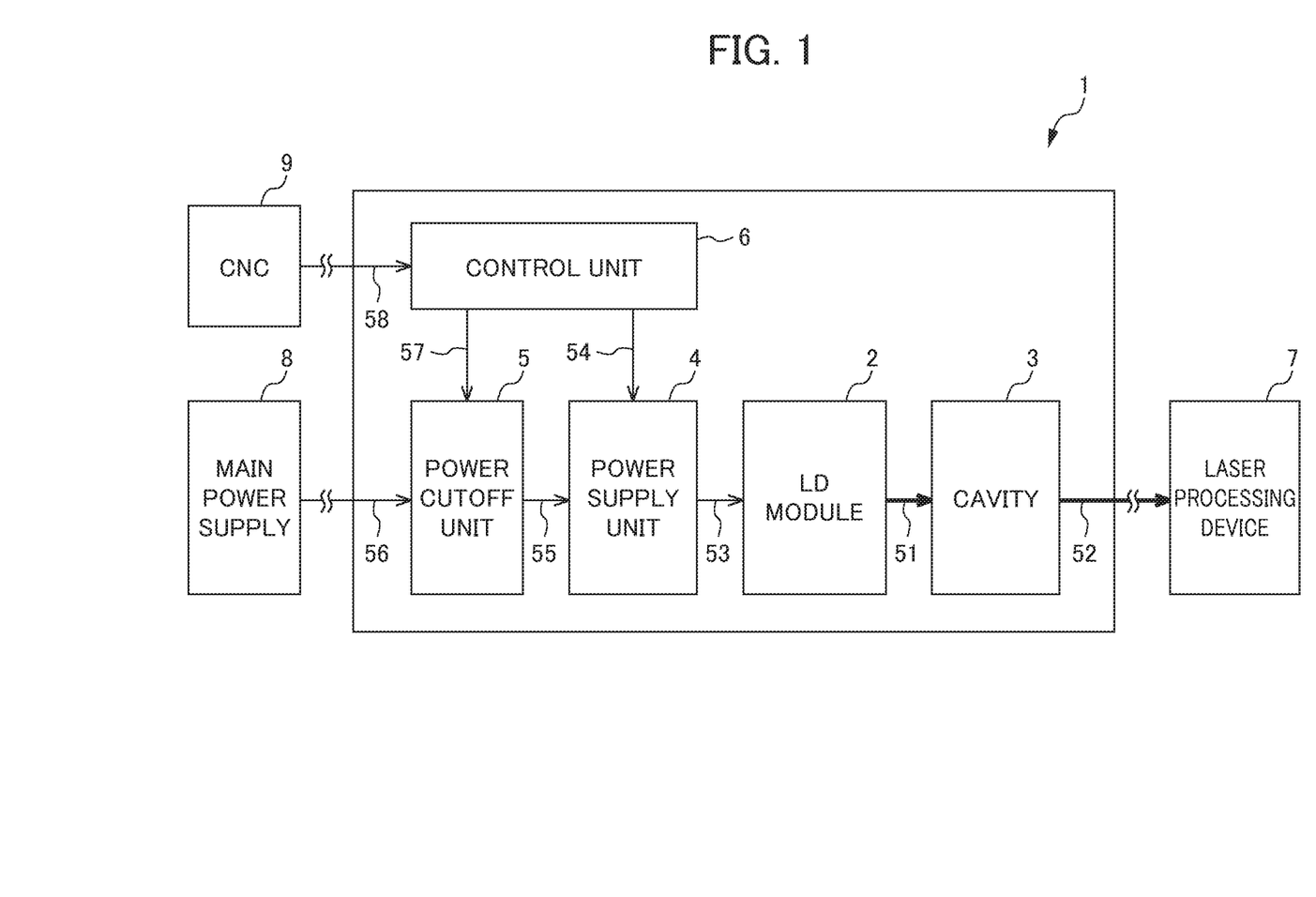
FIG. 1 a block diagram showing the functional configuration of a laser device 1 according to an embodiment.

FIG. 1 is a block diagram showing the functional configuration of the laser device 1 of this embodiment. The laser device 1 of this embodiment is a device that supplies a laser beam to a laser processing device 7. As shown in FIG. 1, the laser device 1 includes an LD module (light-emitting unit.) 2, a cavity (amplification unit) 3, a power supply unit 4, a power cutoff unit 5, and a control unit 6. Among these, the LD module 2, the power supply unit 4, the power cutoff unit 5, and the control unit 6 are parts constituting an electrical section. The cavity 3 is a part constituting an optical section. Each of these parts and a water-cooling plate 10 described later are housed together in a housing 20.

The LD module 2 is a laser beam source that generates a laser beam. The LD module 2 is formed of multiple laser diodes (not shown in the drawings). The LD module 2 generates a laser beam of intensity responsive to a current supplied from the power supply unit 4. Laser beams generated by the corresponding laser diodes are fed to the cavity 3 through multiple optical fibers 51. The LD module 2 is a heat-generating part required to be cooled.

The cavity 3 amplifies a laser beam fed from the LD module 2. A laser beam generated by each laser diode is amplified by the cavity 3 and then output through one optical fiber 52 to the laser processing device 7 as an external device. The laser processing device 7 is a device that processes a work by emitting the laser beam from a cutting head (not shown in the drawings). The cavity 3 is a heat-generating part required to be cooled.

The power supply unit 4 is a power supply circuit that supplies a current for generating a laser beam to the LD module 2. The power supply unit 4 is connected to the LD module 2 via electrical cables 53. The power supply unit 4 is connected to the control unit 6 via signal cables 54. The power supply unit 4 supplies a current to the LD module 2 or stops supply of the current in response to a control signal fed from the control unit 6. As described later, the power supply unit 4 includes parts required to be cooled such as an IC and a capacitor (not shown in the drawings), for example, and parts not required to be cooled such as an FED and a diode (not shown in the drawings), for example. In the laser device 1, the power supply unit 4 as a whole is treated as a heat-generating part required to be cooled.

The power cutoff unit 5 is a circuit that allows interruption of supply of a current from the power supply unit 4 to the LD module 2. The power cutoff unit 5 is a circuit including electrical parts such as a fuse and a breaker, for example. These electrical parts are exchangeable through an opening part 215 formed in the housing 20 described later. The power cutoff unit 5 is connected to the power supply unit 4 via electrical cables 55. The power cutoff unit 5 is connected to a main power supply 8 via power cables 56. Further, the power cutoff unit 5 is connected to the control unit 6 via signal cables 57. The power cutoff unit 5 operates so as to interrupt supply of a current from the power supply unit 4 to the LD module 2 in response to a control signal fed from the control unit 6 in case of emergency, for example. The power cutoff unit 5 is a part not required to be cooled.

The control unit 6 is a circuit that controls output of a laser beam from the laser device 1. The control unit 6 controls the operation of the power supply unit 4 in response to a control signal fed from the control unit 6 via the signal cables 54, and controls the operation of the power cutoff unit 5 in response to a control signal fed from the control unit 6 via the signal cables 57. The control unit 6 is connected to a CNC 9 via signal cables 58. The CNC 9 is a numerical controller that controls the operation of the laser device 1. The control unit 6 controls the operations of the power supply unit 4, the power cutoff unit 5, etc. in response to control signals fed from the CNC 9. The control unit 6 is a part not required to be cooled.

Figure 2:
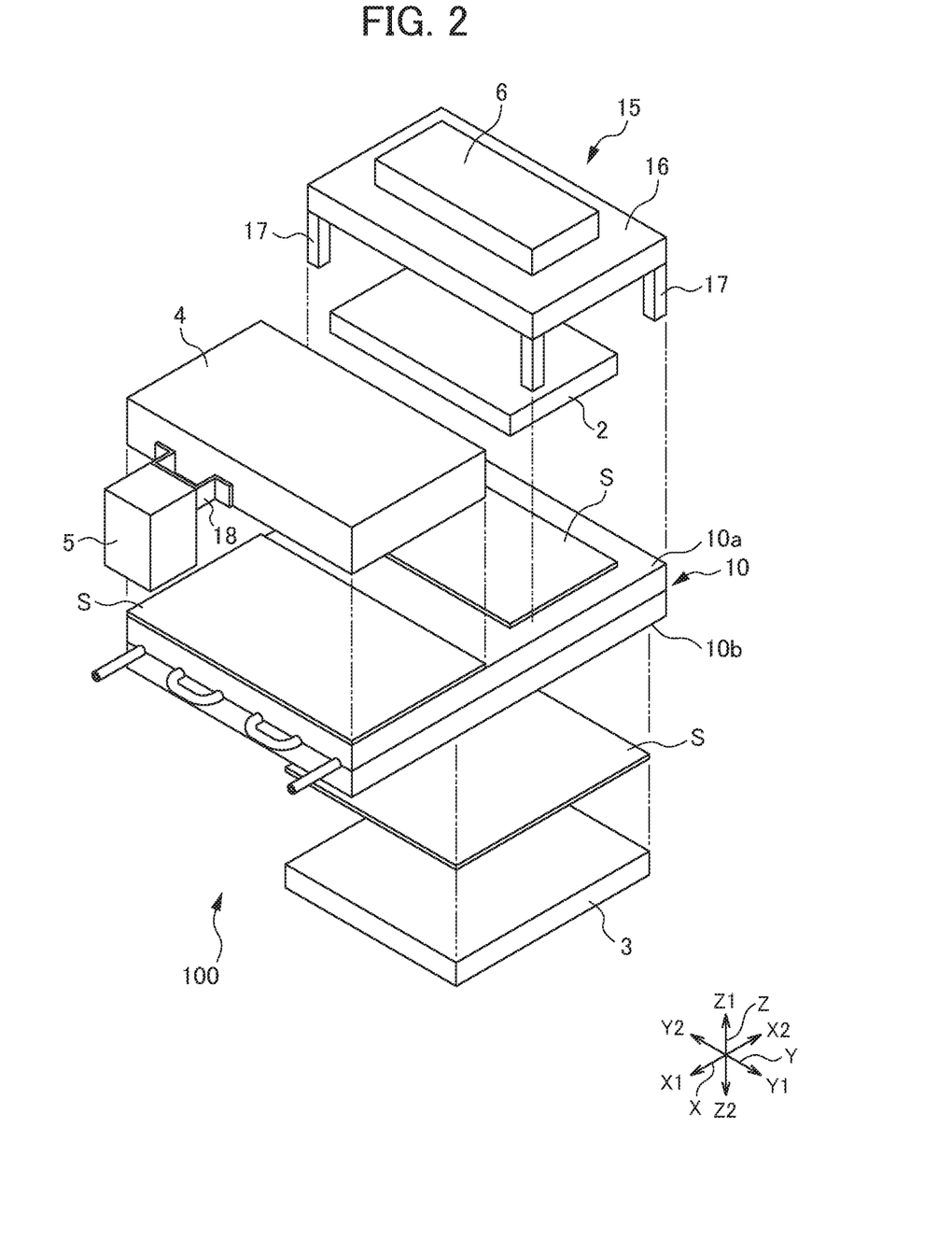
FIG. 2 is an exploded perspective view showing a principal section of the laser device 1.
Figure 3:
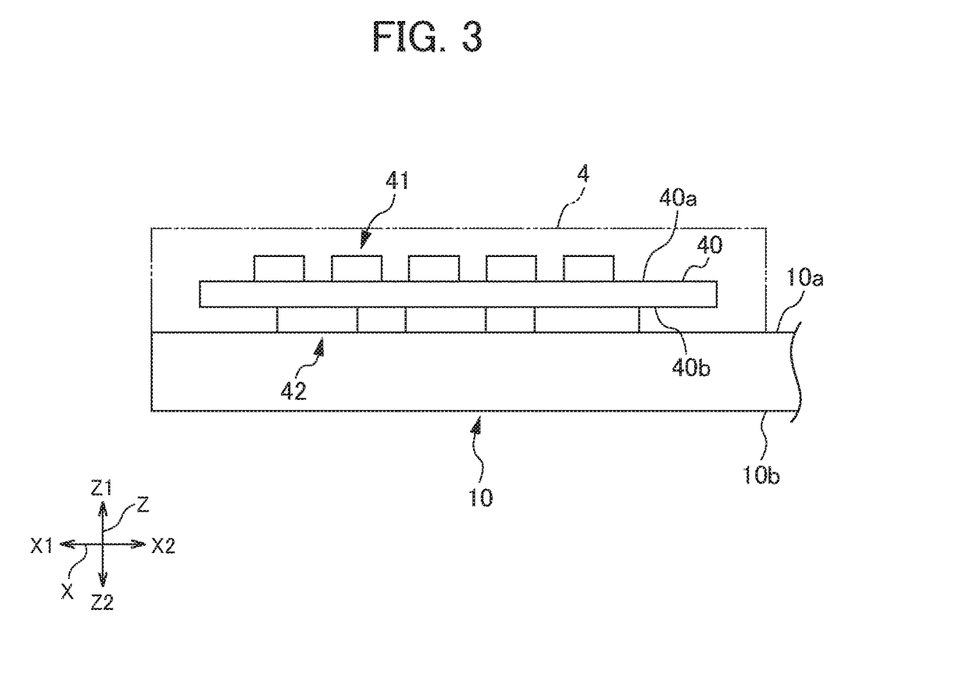
FIG. 3 is a side view of a power supply unit 4 when viewed from a Y1 direction.
Figure 4:
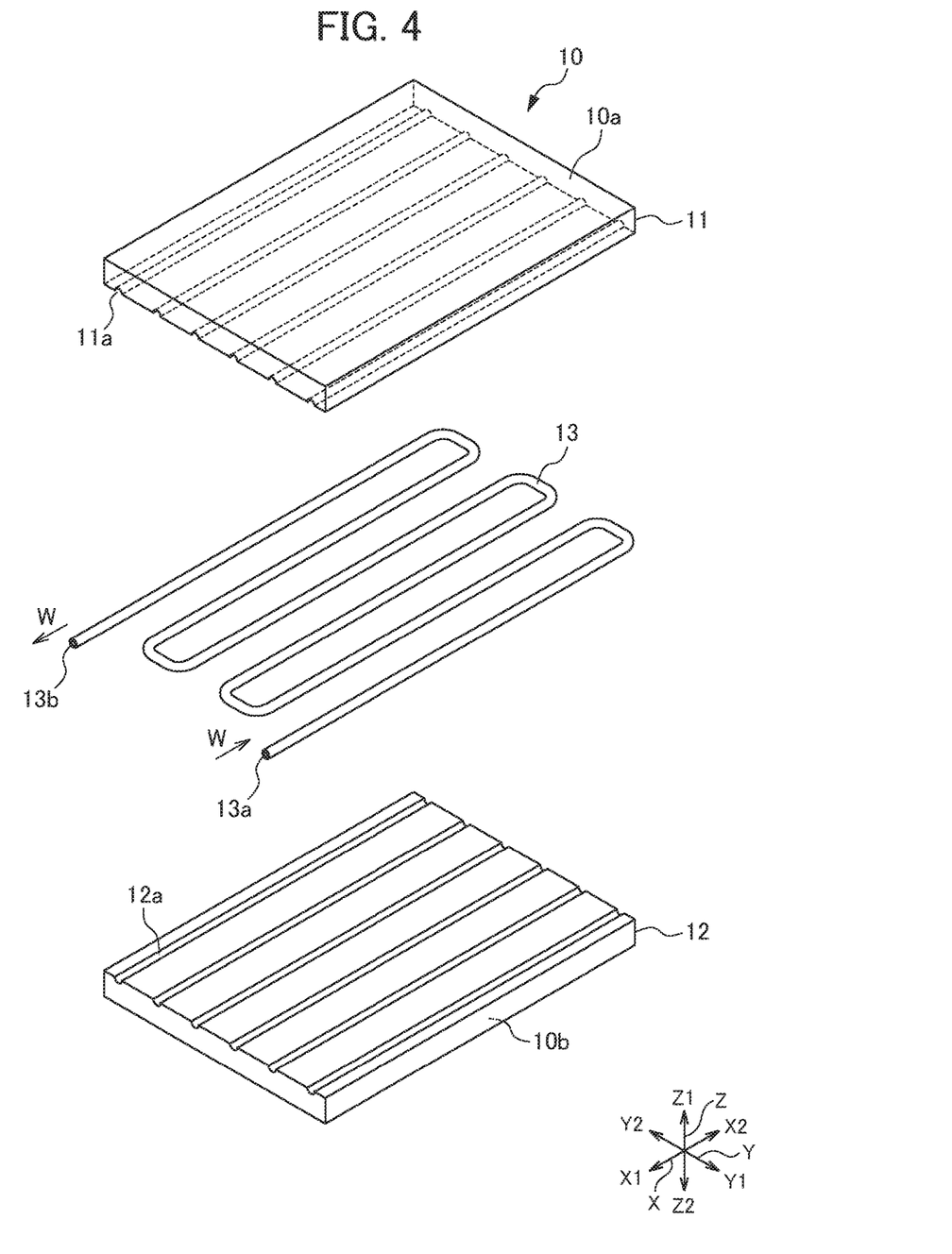
FIG. 4 is an exploded perspective view of a water-cooling plate 10.

The internal configuration of the laser device 1 will be described next. FIG. 2 is an exploded perspective view showing a principal section of the laser device 1. FIG. 3 is a side view of the power supply unit 4 when viewed from a Y1 direction. FIG. 4 is an exploded perspective view of the water-cooling plate 10. Illustrations of the housing 20 (described later), various cables, optical fibers, etc. are omitted in FIGS. 2 and 3.

As shown in FIG. 2, the water-cooling plate (cooling unit) 10 is a plate-like part including a first cooling surface 10a and a second cooling surface 10b (these surfaces will also be called a "cooling surface" collectively). The "plate-like shape" means a shape like a plate if viewed as a whole. This shape is not always required to be a uniform thickness but may have nonuniform thicknesses. All the parts constituting the laser device 1 are arranged separately between a front side of the water-cooling plate 10 and a rear side of the water-cooling plate 10. The water-cooling plate 10 cools the above-described heat-generating parts such as the LD module 2, the cavity 3, etc. As described later, the water-cooling plate 10 further functions as a reinforcing member for the housing 20.

In this embodiment, in the thickness direction (Z direction) of the water-cooling plate 10, a surface on a Z1 side is the first cooling surface 10a, and a surface on a Z2 side is a cooling surface 10b. The first cooling surface 10a and the second cooling surface 10b are oppositely positioned to each other. When one of the first cooling surface 10a and the second cooling surface 10b is a front surface, the other is rear surface. Thus, in the thickness direction (Z direction) of the water-cooling plate 10, when a surface on the Z2 side is the first cooling surface 10a, the surface on the Z1 side is the second cooling surface 10b.

The LD module 2 and the power supply unit 4 are heat-generating parts required to be cooled, so that they are arranged adjacent to the first cooling surface 10a of the water-cooling plate 10. "Being adjacent to the first cooling surface 10a" mentioned herein includes not only arrangement directly on a surface of the first cooling surface 10a (abuts on this surface) but also includes arrangement having interposed therebetween a heat-conducting sheet S or grease having heat conductivity described later, for example. "Being adjacent to the first cooling surface 10a" further includes arrangement with a gap (clearance) between the first cooling surface 10a, and the LD module 2 and the power supply unit 4 in a range in which cooling effect by the first cooling surface 10a is achieved. The foregoing description also applies to the second cooling surface 10b. The configuration of the water-cooling plate 10 will be described later.

The LD module 2 is arranged at the first cooling surface 10a of the water-cooling plate 10 with the heat-conducting sheet (intermediate member) S interposed therebetween. The heat-conducting sheet S is a sheet-like member for increasing contact tightness and heat conductivity between part arranged at the cooling surface and the cooling surface. The sheet-conducting sheet S is made of silicone, for example. The heat-conducting sheet S may be replaced by application of grease having heat conductivity. For example, silicone can be used as the grease having heat conductivity. Each part may be arranged directly on the cooling surface of the water-cooling plate 10 without an intervention such as the sheet-conducting sheet S therebetween. The power supply unit 4 is arranged at the first cooling surface 10a of the water-cooling plate 10 having interposed therebetween the heat-conducting sheet S or the grease having heat conductivity at a position different from the LD module 2.

As shown in FIG. 3, the power supply unit 4 includes a printed board 10, a first part group 41, and a second part group 42. Illustrations of parts such as the heat-conducting sheet S, interconnect lines, etc. are omitted from FIG. 3. The printed board 40 is an insulating plate-like member on which the first part group 41 and the second part group 42 are arranged. The printed board 40 includes a first surface 40a and a second surface 40b. The first surface 40a is positioned on the Z1 side in the thickness direction (Z direction) of the printed board 40. The second surface 40b is positioned on the Z2 side in the thickness direction of the printed board 40.

The first part group 41 is an assembly mainly including parts not required to be cooled. For example, the first part group 41 includes an IC, a capacitor, etc. The first part group 41 is arranged on the first surface 40a of the printed board 40. The second part group 42 is an assembly mainly including parts required to be cooled. For example, the second part group 42 includes a switching element such as an FET. The second part group 42 is arranged on the second surface 40b of the printed board 40.

As shown in FIG. 3, the part groups 41 and 42 constituting the power supply unit 4 are arranged on the printed board 40, thereby reducing the number or interconnect lines between parts. In the power supply unit 4, the first part group 41 and the second part group 42 are mounted separately on the first surface 40a and the second surface 40b of the printed board 40 respectively. Thus, the configuration shown in FIG. 3 can contribute to saving of space for the power supply unit 4.

As shown in FIG. 3, the first part group 41 arranged on the first surface 40a of the printed board 40 does not contact the first cooling surface 10a of the water-cooling plate 10. Thus, the first cooling surface 10a of the water-cooling plate 10 does not absorb redundant heat from the first part group 41 not required to be cooled. Meanwhile, the second part group 42 arranged on the second surface 10b of the printed board 10 contacts the first cooling surface 10a of the water-cooling plate 10. Thus, the second part group 42 required to be cooled can be cooled more efficiently by the first cooling surface 10a of the water-cooling plate 10.

The LD module 2 and the power supply unit 4 described above are heat-generating parts. Thus, both the LD module 2 and the power supply unit 4 are arranged at the first cooling surface 10a of the water-cooling plate 10 having interposed therebetween the heat-conducting sheet S or the grease having heat conductivity. The LD module 2 and the power supply unit 4 arranged at the first cooling surface 10a of the water-cooling plate 10 are cooled with cooling water W (see FIG. 4) flowing through the inside of the water-cooling plate 10.

As shown in FIG. 2, the control unit 6 is arranged closer to the Z1 side in the thickness direction (Z direction) of the water-cooling plate 10 than the LD module 2. The control unit 6, which is a part not required to be cooled, is arranged on a support table 15 provided on the first cooling surface 10a of the water-cooling plate 10.

The support table 15 is composed of a support plate 16 and four feet 17. The support plate 16 is a plate member on which the control unit 6 is installed. The feet 17 are support members arranged at the four corners of the support plate 16 on the Z2 side. The feet 17 are attached to the first cooling surface 10a of the water-cooling plate 10 with screws (not shown in the drawings). The support table 15 is attached in a removable fashion to the water-cooling plate 10, so that it does not hinder maintenance, exchange, etc. of the LD module 2 arranged at the first cooling surface 10a of the water-cooling plate 10. The support plate 16 and the feet 17 are made of metallic plates such as aluminum alloy plates, stainless steel plates, or steel plates, for example.

The control unit 6 is arranged at a position separated from the first cooling surface 10a of the water-cooling plate 10 by the length of the feet 17 in the Z direction. In the thickness direction (Z direction) of the water-cooling plate 10, a gap between the support plate 16 and the first cooling surface 10a of the water-cooling plate 10 is set at a length that avoids interference of a surface of the support plate 16 on the Z2 side with the LD module 2. As a result of provision of the support table 15 on the first cooling surface 10a of the water-cooling plate 10, the LD module 2 is substantially covered by the support table 15 in a plan view.

The power cutoff unit 5 is arranged at a position not overlapping the water-cooling plate 10 in the thickness direction (Z direction) of the water-cooling plate 10. At the water-cooling plate 10, the power cutoff unit 5 is arranged on the opposite side to the LD module 2. In this embodiment, the power cutoff unit 5 attached to a side surface of the power supply unit 4 with a bracket 18. The power cutoff unit 5 may be attached to any position that does not overlap the water-cooling plate 10 in the thickness direction (Z direction) of the water-cooling plate 10. For example, the power cutoff unit 5 may be arranged at a side surface of the water-cooling plate 10 or that of the housing 20.

The cavity 3 is a heat-generating part required to be cooled, so that the cavity 3 is arranged adjacent to the second cooling surface 10b of the water-cooling plate 10. The cavity 3 is arranged at the second cooling surface 10b of the water-cooling plate 10 having interposed therebetween the heat-conducting sheet S or the grease having heat conductivity. In the following description, the LD module 2, the cavity 3, the power supply unit 4, the control unit 6, the water-cooling plate 10, etc. shown in FIG. 2 assembled into one section is also called the "main body section 100."

The configuration of the water-cooling plate 10 will be described next. As shown in FIG. 4, the water-cooling plate 10 includes a first cooling plate 11, a second cooling plate 12, and a cooling pipe 13. The first cooling plate 11 is a plate-like member constituting the above-described first cooling surface 10a. The first cooling plate 11 includes locating grooves 10a. The locating grooves 11a are grooves where the cooling pipe 13 is housed. The locating grooves 11a are formed to extend in the longitudinal direction (X direction) of the first cooling plate 11. The second cooling plate 12 is a plate-like member constituting the above-described second cooling surface 10b. The second cooling plate 12 includes locating grooves 12a. The locating grooves 12a are grooves where the cooling pipe 13 is housed. The locating grooves 12a are formed to extend in the longitudinal direction (X direction) of the second cooling plate 12. The first cooling plate 11 and the second cooling plate 12 are each made of a material having high heat conductivity such as an aluminum alloy or a copper alloy, for example.

The cooling pipe 13 is a pipe-like member in which the cooling water W (coolant) flows. The cooling pipe 13 is made of a material having high heat conductivity such as copper, for example. While not shown in the drawings, the cooling pipe 13 has one end portion 13a and an opposite end portion 13b extending to reach a side surface of the housing 20 on the X1 side. A coupler (not shown in the drawings) is attached to the side surface of the housing 20 on the X1 side. The cooling pipe 13 is connected through the coupler to external piping (not shown in the drawings) extending from a heat exchanger.

The cooling pipe 13 is placed in between the locating grooves 11a of the first cooling plate 11 and the locating grooves 12a of the second cooling plate 12. Then, the cooling plates 11 and 12 are bonded to form the water-cooling plate 10. As shown in FIG. 4, the cooling water W is supplied from the heat exchanger (not shown in the drawings) to the one end portion 13a of the cooling pipe 13. The cooling water W supplied to the cooling pipe 13 flows through the inside of the cooling pipe 13 to absorb heat from (exchange heat with) the first cooling surface 10a of the first cooling plate 11 and the second cooling surface 10b of the second cooling plate 12. Then, the heat is transferred through the opposite end portion 13b to the heat exchanger. The water-cooling plate described in this embodiment is a pinching-type water-cooling plate. Alternatively, a water-cooling plate of a different configuration such as a pipe expansion type is applicable.

Figure 5:
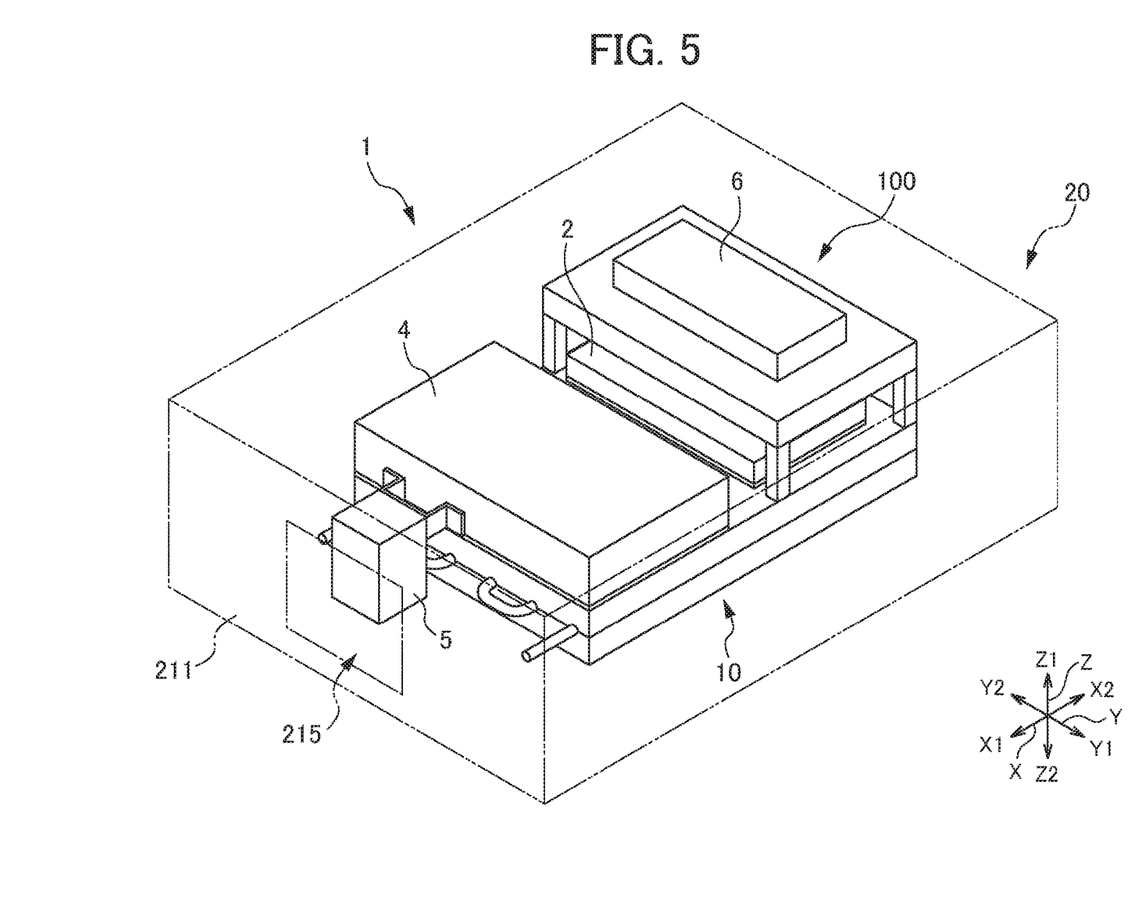
FIG. 5 is a perspective view showing the position relation between a housing 20 and a main body section 100 of the laser device 1.
Figure 6:
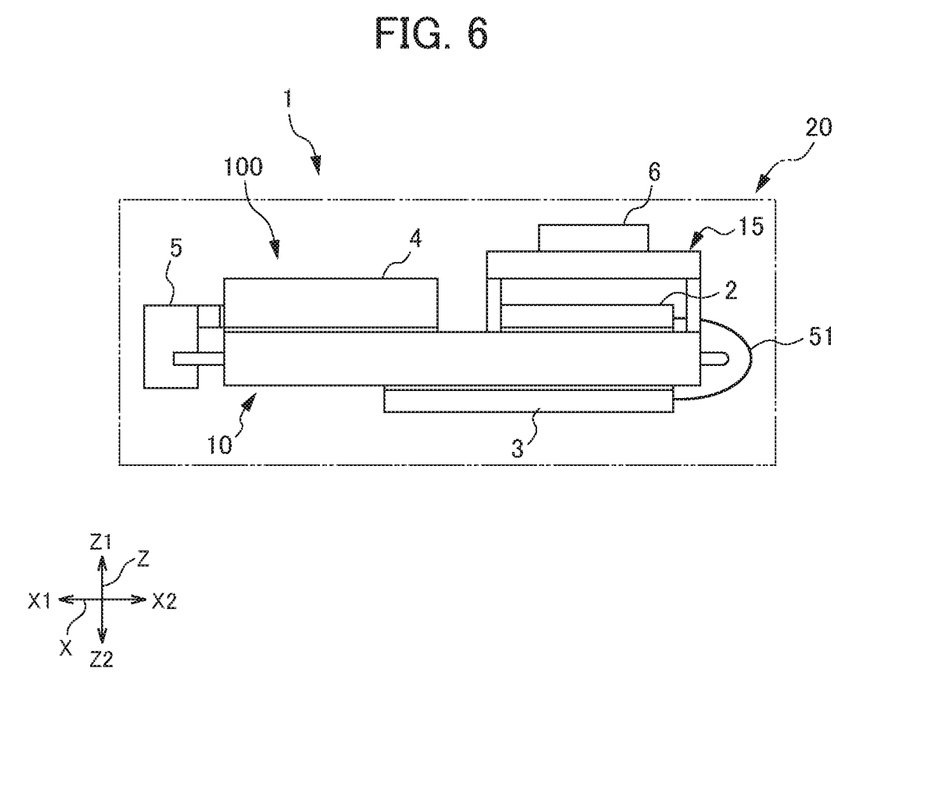
FIG. 6 is a side view of the laser device 1 when viewed from the Y1 direction.
Figure 7:
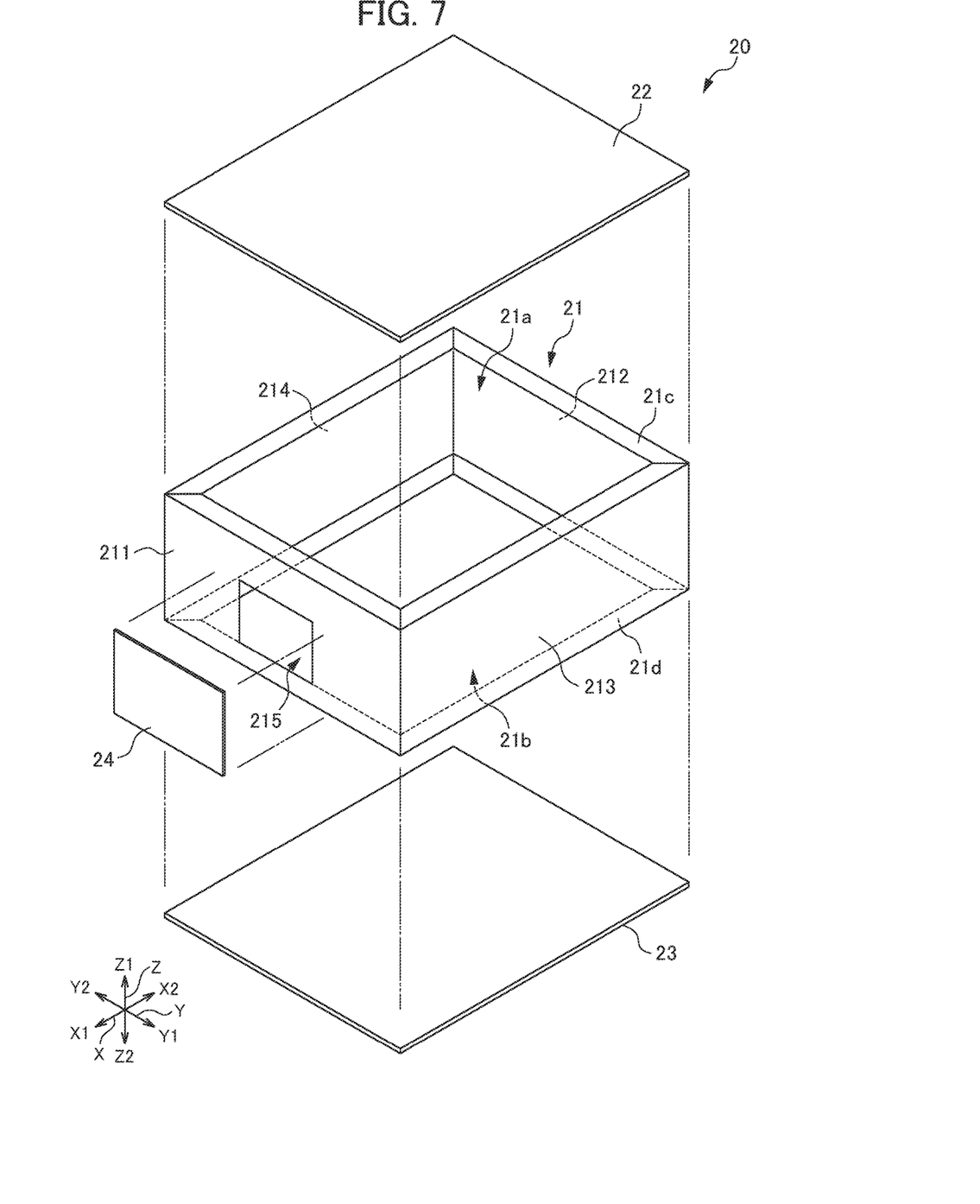
FIG. 7 is an exploded perspective view of the housing 20.

The following describes the housing 20 in which the main body section 100 of the laser device 1 is housed. FIG. 5 is a perspective view showing the relational position between the housing 20 and the main body section 100 of the laser device 1. FIG. 6 is a side view of the laser device 1 when viewed from the Y1 direction. FIG. 7 is an exploded perspective view of the housing 20. In FIGS. 5 and 6, the housing 20 is shown by phantom lines (chain double-dashed lines).

As shown in FIG. 5, the housing 20 includes the opening part 215 formed in a side plate 211 on the X1 side (described later). The opening part 215 is an opening for allowing maintenance, exchange, etc. of at least one of parts (not shown in the drawings) provided at the power cutoff unit 5 such as a fuse and a breaker, for example, while the main body section 100 is housed in the housing 20. The power cutoff unit 5 is a part not required to be cooled as described above, so that the power cutoff unit 5 is arranged at a position separated from the water-cooling plate 10 in the main body section 100. Thus, the presence of the opening part 215 in the side plate 211 of the housing 20 formed at a position facing the power cutoff unit 5 allows maintenance, exchange, etc. of a part of the power cutoff unit 5 such as a fuse or a breaker. At the water-cooling plate 10, the power cutoff unit 5 is arranged on the opposite side to the LD module 2. Thus, the power cutoff unit 5 does not hinder mounting of the optical fiber 51 for connecting the LD module 2 and the cavity 3.

As shown in FIG. 6, the optical fiber 51 for connecting the LD module 2 and the cavity 3 is mounted so as to be routed around a side surface of the water-cooling plate 10. This configuration reduces the occurrence of contact with the optical fiber 51 by a finger of an operator or a tool, for example, during assembly, maintenance, etc. of the main body section 100 from the Z1 side of the housing 20, making it possible to reduce damage on the optical fiber 51. As shown in FIG. 6, the main body section 100 includes the support table provided on the Z1 side of the LD module 2. This configuration further reduces the occurrence of contact with the optical fiber 51 by a finger of an operator or a tool, for example, so that damage on the optical fiber 51 can be reduced more effectively.

As shown in FIG. 7, the housing 20 includes an outer frame 21, a top plate 22, a bottom plate 23, and a closing plate 24. Each part constituting the housing 20 is made of an aluminum alloy plate, a stainless steel plate, or a steel plate, for example. The outer frame 21 is a part as a main body of the housing 20. The outer frame 21 includes the side plate 211, a side plate 212, a side plate 213, and a side plate 214. The side plate 211 is a plate member located on the X1 side of the outer frame 21. The opening part 215 described above is formed in the side plate 211. The side plate 212 is a plate member located on the X2 side of the outer frame 21. The side plate 213 is a plate member located on the Y1 side of the outer frame 21. The side plate 214 is a plate member located on the Y2 side of the outer frame 21. While not shown in FIG. 7, the housing 20 includes a support section 30 (described later) inside the housing 20.

At the outer frame 21, four surfaces in the X—Y directions are surrounded by the side plates 211 to 214. At the outer frame 21, two surfaces in the Z direction are provided with an opening part 21a and an opening part 21b. The opening part 21a of the outer frame 21 is an opening located on the Z1 side. The opening part 21b of the outer frame 21 is an opening located on the Z2 side.

The housing 20 includes the opening part 21a formed on the Z1 side. Thus, in the main body section 100, this can facilitate assembly, maintenance, exchange, etc. of parts arranged adjacent to the first cooling surface 10a of the water-cooling plate 10 including the LD module 2, the power supply unit 4, the control unit 6, etc. The housing 20 includes the opening part 21b formed on the Z2 side. Thus, in the main body section 100, this can facilitate assembly, maintenance, exchange, etc. of a part arranged adjacent to the second cooling surface 10b of the water-cooling plate 10 such as the cavity 3.

The top plate 22 is a plate member for closing the opening part 21a (Z1 side) of the outer frame 21. The bottom plate 23 is a plate member for closing the opening part 21b (Z2 side) of the outer frame 21. The top plate 22 and the bottom plate 23 are attached to an edge 21c of the outer frame 21 on the Z1 side and to an edge 21d of the outer frame 21 on the Z2 side respectively with screws (not shown in the drawings), for example.

In an ordinary state of use of the laser device 1, the thickness direction (Z direction) of the laser device 1 does not always agree with the vertical direction. If multiple laser devices 1 are housed in a line in a rack, for example, these laser devices 1 may be aligned in such a manner that the thickness directions of the laser devices 1 agree with the horizontal direction. In this embodiment, for the convenience of description, names "top plate" and "bottom plate" are given based on the arrangement shown in FIG. 7. It should be noted that these names do not limit the upward direction and the downward direction in the state of use of the laser device 1.

The closing plate 24 is a plate member for closing the opening part 215 in the side plate 211. The closing plate 24 is attached to the side plate 211 with a screw (not shown in the drawings), for example. While the laser device 1 operates, the opening part 215 in the side plate 211 is closed by the closing plate 24. For maintenance of the laser device 1, the screw with which the closing plate 24 is engaged with the side plate 211 is loosened and removed to expose the opening part 215. This allows maintenance, exchange, etc. of a part of the power cutoff unit 5 such as a fuse or a breaker through the opening part 215.

Figure 8:
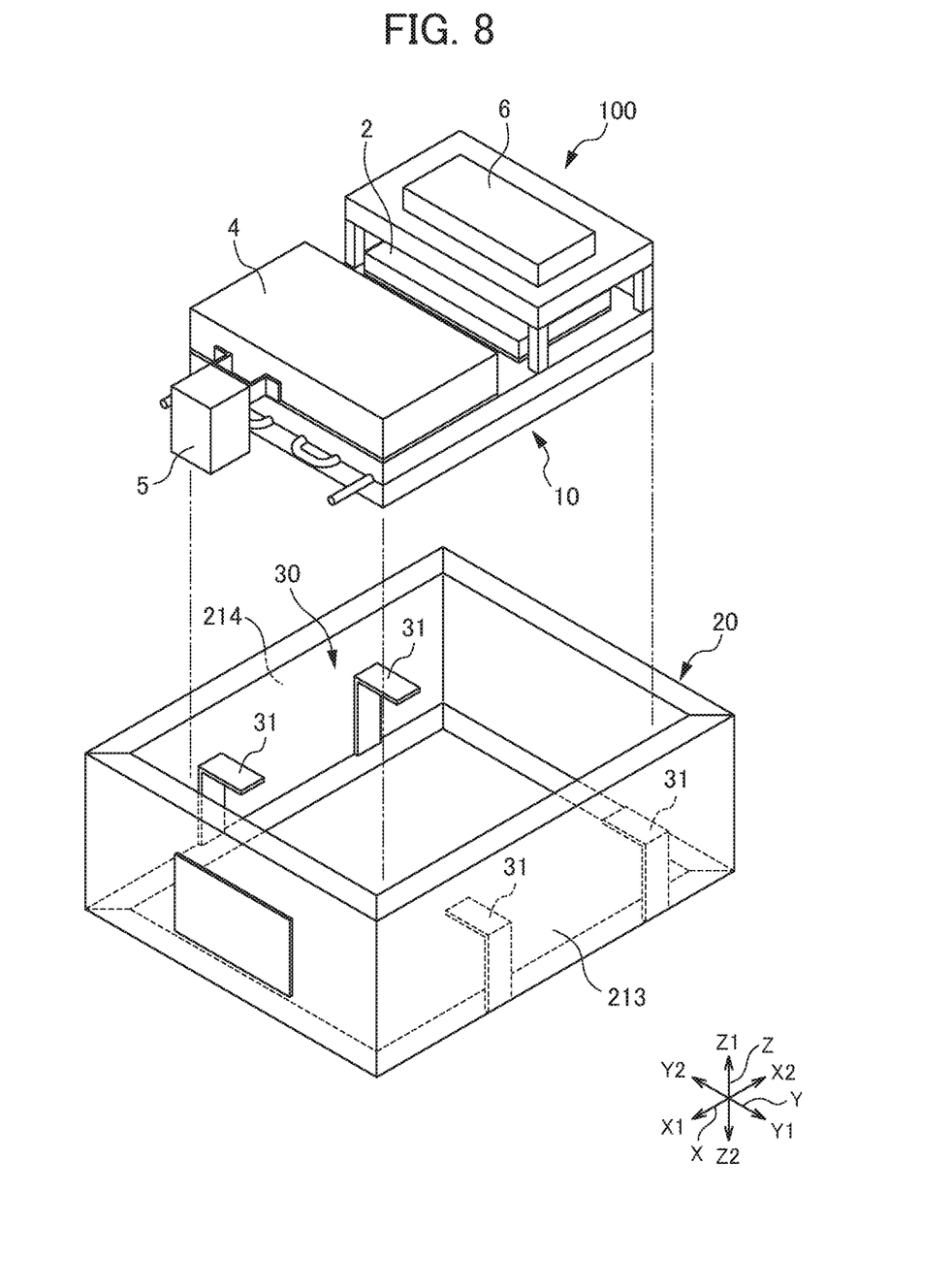
FIG. 8 is a perspective view showing a support section 30 provided in the housing 20.
Figure 9:
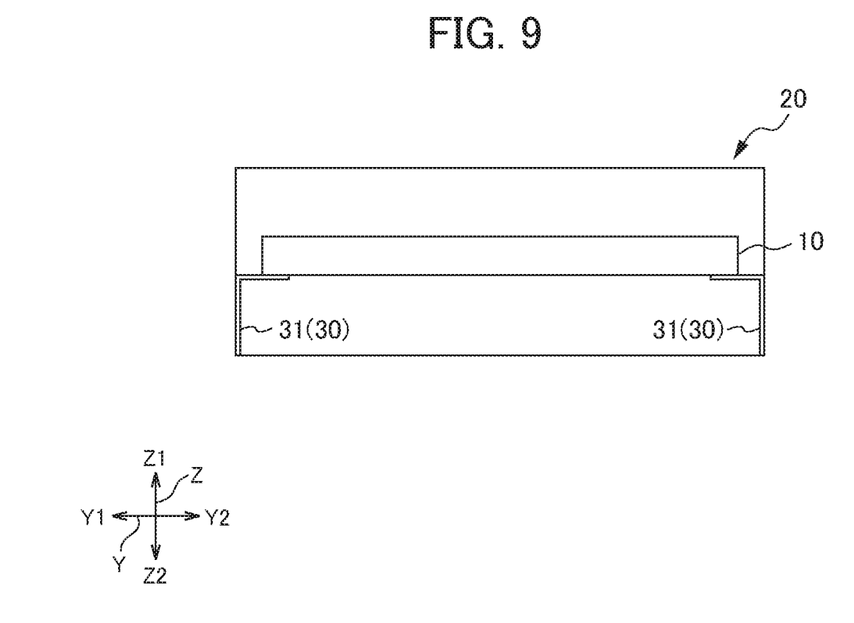
FIG. 9 is a sectional view in a Y-Z plane taken at an intermediate position of the housing 20 in an X direction.

A structure for supporting the main body section 100 in the housing 20 will be described next. FIG. 8 is a perspective view showing the support section 30 provided in the housing 20. FIG. 9 is a sectional view in a Y-Z plane taken at an intermediate position of the housing 20 in the X direction. FIG. 9 only shows the water-cooling plate 10 of the main body section 100 fixed to the support section 30.

As shown in FIG. 8, the housing 20 includes the support section 30 inside the housing 20. The support section 30 is a section for fixing the main body section 100 (water-cooling plate 10) inside the housing 20. The support section 30 is formed of support fittings (support members) 31 each having an inverted L-shape. In the housing 20, two support fittings 31 aligned in the X direction are attached to the side plate 213. Further, two support fittings 31 aligned in the X direction are attached to the side plate 214. The support fittings 31 is attached in such a manner that a projecting portion of the inverted L-shape of this support fitting 31 pointed inwardly. As shown in FIG. 8, the main body section 100 is housed from the Z1 side toward the Z2 side in the thickness direction (Z direction) of the housing 20, for example.

As shown in FIG. 9, the main body section 100 is housed in the housing 20 while opposite end portions of the water-cooling plate 10 in the Y direction are supported on the support fittings 31. Specifically, the water-cooling plate 10 is fixed to the four support fittings 31 in total provided at the two side plates 213 and 214. In this state, the water-cooling plate 10 and the support fittings 31 are engaged with screws (not shown in the drawings), for example. By doing so, the main body section 100 can be fixed in the housing 20. The main body section 100 can be taken out from the housing 20 by loosening and removing the screws with which the water-cooling plate 10 is engaged with the support fittings 31.

The laser device 1 of the above-described embodiment achieves the following effects, for example. In the laser device 1 of this embodiment, the LD module 2 and the power supply unit 4 are arranged adjacent to the first cooling surface 10a of the water-cooling plate 10, and the cavity 3 is arranged adjacent to the second cooling surface 10b of the water-cooling plate 10. This configuration achieves effective use of space for installation of the parts of the water-cooling plate 10. Thus, compared to a case where the above-described parts are arranged adjacent to one of the surfaces of the water-cooling plate 10, the device is allowed to have a compact size. In the laser device 1 of this embodiment, only the heat-generating parts required to be cooled are arranged adjacent to the first cooling surface 10a and the second cooling surface 10b of the water-cooling plate 10. In this configuration, the first cooling surface 10a and the second cooling surface 10b of the water-cooling plate 10 do not absorb redundant heat from a part not required to be cooled. Thus, the heat-generating parts required to be cooled can be cooled more efficiently. As a result, the laser device 1 of this embodiment becomes capable of cooling the heat-generating parts more efficiently while achieving a compact size.

In the laser device 1 of this embodiment, the LD module 2 and the power supply unit 4 are arranged adjacent to the same first cooling surface 10a. This facilitates wiring of signal cables, compared to a case where the LD module 2 and the power supply unit 4 are arranged separately to be adjacent to the front surface and the rear surface of the water-cooling plate 10. Further, the water-cooling plate 10 is not required to be given a through hole, etc. for the signal cables. As a result, limitations on designing the water-cooling plate 10 can be reduced without causing strength reduction of the water-cooling plate 10.

In the laser device 1 of this embodiment, the LD module 2 constituting the electrical section and the cavity 3 constituting the optical section are arranged adjacent to the opposite cooling surfaces of the water-cooling plate 10. Thus, the optical fiber 51 for connecting the LD module 2 and the cavity 3 is mounted so as to be routed around the side surface of the water-cooling plate 10. This configuration reduces the occurrence of contact with the optical fiber 51 by a finger of an operator or a tool, for example, during assembly, maintenance, etc. of the main body section 100 from the Z1 side of the housing 20. This makes it possible to reduce damage on the optical fiber 51, compared to a case where the optical fiber 51 is mounted adjacent to the first cooling surface 10a of the water-cooling plate 10 like the LD module 2.

In the laser device 1 of this embodiment, the control unit is arranged on the support table 15. This forms a gap between the control unit 6 and the first cooling surface 10a of the water-cooling plate 10. This configuration prevents the first cooling surface 10a of the water-cooling plate 10 from absorbing redundant heat from the control unit 6 not required to be cooled, so that the heat-generating parts required to be cooled can be cooled more efficiently.

In the laser device 1 of this embodiment, a gap is formed between the support table 15 and the top plate 22 of the housing 20. A gap is further formed between the support table and the first cooling surface 10a of the water-cooling plate 10. Thus, even if the control unit 6 generates heat, the generated heat can be released efficiently. The gap formed between the support table 15 and the first cooling surface 10a of the water-cooling plate 10 allows the transfer of heat generated at the LD module 2 or the power supply unit 4 to the control unit 6 to be suppressed.

In the laser device 1 of this embodiment, the support table 15 on which the control unit 6 is arranged can be attached to and removed from the water-cooling plate 10 freely, thereby causing no hindrance to maintenance, exchange, etc. of the LD module 2. Further, arrangement of the control unit 6 on the support table 15 achieves effective use of space for installation of the parts of the first cooling surface 10a of the water-cooling plate 10. Thus, the device is allowed to have a more compact size.

In the laser device 1 of this embodiment, the power cutoff unit 5 is arranged at a position not overlapping the water-cooling plate 10 in the thickness direction (Z direction) of the water-cooling plate 10. The housing 20 includes the opening part 215 formed at a position facing the power cutoff unit 5. This configuration allows maintenance, exchange, etc. of a part of the power cutoff unit 5 such as a fuse or a breaker through the opening part 215 without the need to disassemble the laser device 1. At the water-cooling plate 10, the power cutoff unit 5 is arranged on the opposite side to the LD module 2. Thus, the power cutoff unit 5 does not hinder mounting of the optical fiber 51 for connecting the LD module 2 and the cavity 3.

In the laser device 1 of this embodiment, the water-cooling plate 10 is fixed to the support section 30 provided inside the housing 20. Thus, the water-cooling plate 10 becomes usable as a reinforcing member for the housing 20. This configuration eliminates the need to provide a reinforcing member inside or outside the housing 20, so that the laser device 1 is allowed to have a compact size and a reduced weight. Further, the rigidity of the housing 20 can be ensured by the water-cooling plate 10, so that large openings such as the opening parts 21a and 21b can be formed in the housing 20. Additionally, design of the shape, arrangement, etc. of each part to be mounted on the water-cooling plate 10 can be made without the need to consider the shape, arrangement, etc. of a reinforcing member. As a result, the housing 20 is allowed to have a simpler design.

In the laser device 1 of this embodiment, each of the LD module 2, the cavity 3, and the power supply unit 4 as a heat-generating part is arranged at the water-cooling plate 10 having interposed therebetween the heat-conducting sheet S or the grease having heat conductivity. This configuration increases heat conductivity while increasing contact tightness between the heat-generating part and the water-cooling plate 10. Thus, heat generated at the heat-generating part can be transferred more efficiently to the water-cooling plate 10. Further, this configuration can enhance insulating properties (increase a withstand voltage) to increase reliability, compared to a case where the heat-generating part is arranged directly on the water-cooling plate 10.

The present invention is not limited to the embodiment of the present invention described above. Various modifications such as those described below various changes are applicable and such modifications or changes are also within the technical scope of the present invention. The effects described in this embodiment are merely a list of the most preferable effects resulting from the present invention. The effects achieved by the present invention are not limited to those described in this embodiment. The above-described embodiment and the following modifications can be combined, as appropriate. However, such combinations will not be described in detail. (Modifications)

In this embodiment, the water-cooling plate 10 using water as a coolant is described as the cooling unit. However, this is not the only case. A coolant usable at the cooing unit may be liquid other than water (such as antifreeze, for example) or may be gas (such as nitrogen, for example). In the example described in this embodiment, the LD module 2, the power supply unit 4, and the control unit 6 are arranged adjacent to the first cooling surface 10a of the water-cooling plate 10, and the cavity 3 is arranged adjacent to the second cooling surface 10b of the water-cooling plate 10. However, this is not the only case. The cavity 3 may be arranged adjacent to the first cooling surface 10a of the water-cooling plate 10, and the LD module 2, the power supply unit 4, and the control unit 6 may be arranged adjacent to the second cooling surface 10b of the water-cooling plate 10.

In this embodiment, the control unit 6 is arranged closer to the Z1 side in the thickness direction (Z direction) of the water-cooling plate 10 than the LD module 2. However, this is not the only case. The control unit 6 may be arranged closer to the Z1 side in the thickness direction (Z direction) of the water-cooling plate 10 than the power supply unit 4. Specifically, as long as the control unit 6 can be arranged so as to form a gap from the LD module 2 or the power supply unit 4, the arrangement of the control unit 6 may be determined based on either the LD module 2 or the power supply unit 4.

In the example described in this embodiment, the support fittings 31 (support section 30) are attached to the side plates 213 and 214 aligned in the Y direction of the housing 20. However, this is not the only case. The support fittings 31 may be attached to the side plates 211 and 212 aligned in the X direction of the housing 20. Alternatively, the support fittings 31 may be attached to any three or all of the four surfaces of the housing 20 corresponding to the side plates 211 to 214.

1: Laser device, 2: LD module, 3: Cavity, 4: Power supply unit, 5: Power cutoff unit, 6: Control unit, 10: Water-cooling plate, 10a: First cooling surface, 10b: Second cooling surface, 20: Housing, 30. Support section, 31: Support fitting, 215: Opening part, S: Heat-conducting sheet.

What is claimed is:

1. A laser device comprising:
   a light-emitting unit that generates a laser beam;
   an amplification unit that amplifies the laser beam generated by the light-emitting unit;
   a power supply unit that supplies power for generating the laser beam to the light-emitting unit;
   a plate-like cooling unit including a first cooling surface and a second cooling surface positioned opposite to the first cooling surface; and
   a housing in which the light-emitting unit, the amplification unit, the power supply unit, and the cooling unit are housed,
   wherein the power supply unit and the light-emitting unit are arranged adjacent to the first cooling surface of the cooling unit,
   the power supply unit includes a printed board, a first part group being an assembly including parts not required to be cooled, and a second part group being an assembly including parts required to be cooled,
   the amplification unit is arranged adjacent to the second cooling surface of the cooling unit, and
   the first part group is arranged on a first surface of the printed board so as not to contact the first cooling surface of the cooling unit, and the second part group is arranged on a second surface being opposite to the first surface of the printed board so as to contact the first cooling surface of the cooling unit.

2. The laser device according to claim 1, further comprising a control unit that controls supply of power from the power supply unit to the light-emitting unit,
   wherein the control unit is arranged in such a manner that, in the thickness direction of the cooling unit, a gap is formed between the control unit and the power supply unit or the light-emitting unit arranged at the first cooling surface of the cooling unit.

3. The laser device according to claim 1, further comprising a power cutoff unit that allows interruption of supply of power from the power supply unit to the light-emitting unit,
   wherein the power cutoff unit is arranged at a position not overlapping the cooling unit in the thickness direction of the cooling unit, and
   the housing includes an opening part formed in a side surface facing the power cutoff unit for allowing putting in and taking out of at least one part of the power cutoff unit.

4. The laser device according to claim 1, wherein the cooling unit is fixed to support members provided at at least two side surfaces of the housing.

5. The laser device according to claim 1, wherein at least one of the power supply unit, the light-emitting unit, and the amplification unit is arranged at the cooling unit with an intermediate member, having heat conductivity, interposed therebetween.

* * * * *